(12) United States Patent
Lee et al.

(10) Patent No.: US 11,630,273 B2
(45) Date of Patent: Apr. 18, 2023

(54) LIGHT DETECTING DEVICE AND OPTICAL SYSTEM INCLUDING THE SAME

(71) Applicants: SAMSUNG ELECTRONICS CO., LTD., Suwon-si (KR); RESEARCH & BUSINESS FOUNDATION SUNGKYUNKWAN UNIVERSITY, Suwon-si (KR)

(72) Inventors: Eunkyung Lee, Seoul (KR); Byounglyong Choi, Seoul (KR); Taejun Gu, Seongnam-si (KR); Dongmok Whang, Yongin-si (KR)

(73) Assignees: SAMSUNG ELECTRONICS CO., LTD., Suwon (KR); RESEARCH & BUSINESS FOUNDATION SUNGKYUNKWAN UNIVERSITY, Suwon (KR)

( * ) Notice: Subject to any disclaimer, the term of this patent is extended or adjusted under 35 U.S.C. 154(b) by 0 days.

(21) Appl. No.: 16/941,786

(22) Filed: Jul. 29, 2020

(65) Prior Publication Data
US 2021/0208351 A1    Jul. 8, 2021

(30) Foreign Application Priority Data
Jan. 7, 2020 (KR) .................. 10-2020-0002145

(51) Int. Cl.
*G02B 6/42* (2006.01)
*G02B 6/02* (2006.01)
(Continued)

(52) U.S. Cl.
CPC .......... *G02B 6/4298* (2013.01); *G02B 6/0218* (2013.01); *G02B 6/1347* (2013.01); *G02B 2006/12142* (2013.01)

(58) Field of Classification Search
CPC .......... G02F 1/29; G02F 1/011; G02F 1/0147; G02B 2006/12142; G02B 6/1347
See application file for complete search history.

(56) References Cited

U.S. PATENT DOCUMENTS 8,053,782 B2    11/2011   Avouris et al.
8,554,022 B1 *  10/2013   Hochberg ............. H01L 31/028
                                                                398/141
(Continued)

FOREIGN PATENT DOCUMENTS

CN    106526904 A    3/2017
CN    208283680 U   12/2018
(Continued)

OTHER PUBLICATIONS

Communication dated Dec. 18, 2020, issued by the European Patent Office in counterpart European Application No. 20183407.4.
(Continued)

*Primary Examiner* — Eric Wong
(74) *Attorney, Agent, or Firm* — Sughrue Mion, PLLC

(57) ABSTRACT

Provided is a light detecting device including a light input device configured to receive light, a plurality of waveguides extending from the light input device, the plurality of waveguides being configured to transmit portions of the light received by the light input device, respectively, a plurality of modulators provided on the plurality of waveguides and configured to modulate phases of the portions of light transmitted in the plurality of waveguides, respectively, at least one graphene layer configured to absorb the portions of light transmitted in the plurality of waveguides, and at least one first electrode and at least one second electrode electrically connected to the at least one graphene layer, respectively.

21 Claims, 10 Drawing Sheets

(51) Int. Cl.
*G02B 6/134* (2006.01)
*G02B 6/12* (2006.01)

(56) References Cited

U.S. PATENT DOCUMENTS

| | | | |
|---|---|---|---|
| 8,648,342 B2 | 2/2014 | Kim et al. | |
| 9,599,770 B2 * | 3/2017 | Englund | G02F 3/022 |
| 9,740,079 B1 * | 8/2017 | Davids | G02B 6/1347 |
| 2013/0101247 A1 * | 4/2013 | Cho | G02F 1/025 |
| | | | 977/734 |
| 2013/0105795 A1 * | 5/2013 | Kim | H01L 31/036 |
| | | | 977/734 |
| 2014/0224989 A1 * | 8/2014 | Long | G02F 1/0136 |
| | | | 977/932 |
| 2016/0033766 A1 | 2/2016 | Hajimiri et al. | |
| 2017/0301819 A1 | 10/2017 | Yao | |
| 2019/0025509 A1 | 1/2019 | Kim et al. | |
| 2019/0296160 A1 * | 9/2019 | Jacob | G02B 6/12004 |
| 2020/0150465 A1 * | 5/2020 | Hu | G02F 1/025 |

FOREIGN PATENT DOCUMENTS

| | | | |
|---|---|---|---|
| CN | 113659016 A | * | 11/2021 |
| CN | 113972295 A | * | 1/2022 |
| EP | 3 418 774 A1 | | 12/2018 |
| JP | 2013-502735 A | | 1/2013 |
| KR | 10-1771427 B1 | | 9/2017 |
| KR | 10-2019-0044413 A | | 4/2019 |

OTHER PUBLICATIONS

Wang et al., "High-responsivity graphene-on-silicon slot waveguide photodetectors," Royal Society of Chemistry, Nanoscale, vol. 8, Jun. 2016, pp. 13206-13211.

Wang et al., "Graphene photodetector integrated on silicon nitride waveguide," Journal of Applied Physics, vol. 117, No. 144504, 2015, Total 6 pages.

* cited by examiner

LIGHT DETECTING DEVICE AND OPTICAL SYSTEM INCLUDING THE SAME

CROSS-REFERENCE TO RELATED APPLICATION

This application claims priority from Korean Patent Application No. 10-2020-0002145, filed on Jan. 7, 2020, in the Korean Intellectual Property Office, the disclosure of which is incorporated herein in its entirety by reference.

BACKGROUND

1. Field

Example embodiments of the present disclosure relate to a light detecting device and an optical system including the same.

2. Description of Related Art

Technologies for obtaining information by reflecting electromagnetic waves at an object or a terrain within a detection distance and measuring a distance, a location, and a shape by using the information have been developed, and a light detection and ranging (LiDAR) system is receiving attention as one of the technologies.

The LiDAR system includes a light steering apparatus for steering light to a desired location and a light detecting device for detecting light reflected from an object after being emitted from the light steering apparatus. To steer the light, a method of mechanically rotating a light irradiation part and a method of using interference of light emitted from a plurality of unit cells or a plurality of waveguides by using an optical phased array (OPA) method are used.

SUMMARY

One or more example embodiments provide a light detecting device and an optical system including the same.

Additional aspects will be set forth in part in the description which follows and, in part, will be apparent from the description, or may be learned by practice of the example embodiments of the disclosure.

According to an aspect of an example embodiment, there is provided a light detecting device including a light input device configured to receive light, a plurality of waveguides extending from the light input device, the plurality of waveguides being configured to transmit portions of the light received by the light input device, respectively, a plurality of modulators provided on the plurality of waveguides and configured to modulate phases of the portions of light transmitted in the plurality of waveguides, respectively, at least one graphene layer configured to absorb the portions of light transmitted in the plurality of waveguides, and at least one first electrode and at least one second electrode electrically connected to the at least one graphene layer, respectively.

The at least one graphene layer may be provided on the plurality of waveguides.

The light detecting device may further include an intermediate layer provided between the at least one graphene layer and the plurality of waveguides, the intermediate layer including a material having a refractive index that is less than a refractive index of each of the plurality of waveguides.

The at least one graphene layer may be provided on at least one of a top surface and a side surface of the plurality of waveguides.

The at least one graphene layer may include a graphene layer corresponding to all of the plurality of waveguides.

The at least one graphene layer may include a plurality of graphene layers respectively corresponding to some of the plurality of waveguides.

The plurality of waveguides may be integrated into one waveguide at one end of each of the plurality of waveguides, and the at least one graphene layer may include a graphene layer provided on the integrated waveguide.

The light detecting device may further include a gate insulating layer provided on the at least one graphene layer and a gate electrode provided on the gate insulating layer.

The light input device may include an antenna array provided at an end portion of the plurality of waveguides and configured to receive light from an outside of the light detecting device.

The plurality of waveguides may include at least one of a Group IV semiconductor material, a Group III-V semiconductor material, a Group II-VI semiconductor material, an oxide, and a nitride.

The plurality of modulators may be configured to form a phase profile by independently modulating a phase of each of the portions of light transmitted in the plurality of waveguides.

The plurality of modulators may be further configured to modulate the phase based on applying an electric signal or heat to each of the plurality of waveguides.

The light input device, the plurality of waveguides, the plurality of modulators, the at least one graphene layer, and the at least one first electrode and the at least one second electrode may be provided on a same substrate.

According to another aspect of an example embodiment, there is provided an optical system including a light steering apparatus configured to steer light, and a light detecting device configured to detect the light steered by the light steering apparatus, wherein the light detecting device includes a light input device, a plurality of waveguides extending from the light input device and configured to transmit portions of light input to the light input device, respectively, a plurality of modulators provided on the plurality of waveguides and configured to modulate phases of the portions of the light transmitted in the plurality of waveguides, respectively, at least one graphene layer configured to absorb the portions of the light transmitted in the plurality of waveguides, and at least one first electrode and at least one second electrode electrically connected to the at least one graphene layer.

The light steering apparatus may include a laser light source and a steering device configured to steer the portions of the light emitted from the laser light source.

The light input device may further include an antenna array provided at an end portion of the plurality of waveguides and configured to receive the light steered by the light steering apparatus.

The at least one graphene layer may be provided on the plurality of waveguides.

The light input device may further include an intermediate layer provided between the at least one graphene layer and the plurality of waveguides, the intermediate layer including a material having a refractive index that is than a refractive index of the plurality of waveguides.

The plurality of waveguides may be integrated into one waveguide at an end portion of the plurality of waveguides, and the at least one graphene layer may include a graphene layer provided on the integrated waveguide.

The light steering apparatus and the light detecting device may be provided on a same substrate.

The at least one first electrode and at least one second electrode may be directly provided on the at least one graphene layer.

The at least one first electrode and at least one second electrode may be connected to the at least one graphene layer by conductive wires.

Each of the plurality of graphene layers may correspond to each of the plurality of waveguides, respectively, and each of the plurality of graphene layers may be spaced apart from each other.

BRIEF DESCRIPTION OF THE DRAWINGS

The above and/or other aspects, features, and advantages of example embodiments of the disclosure will be more apparent from the following description taken in conjunction with the accompanying drawings, in which.

DETAILED DESCRIPTION

Figure 1:
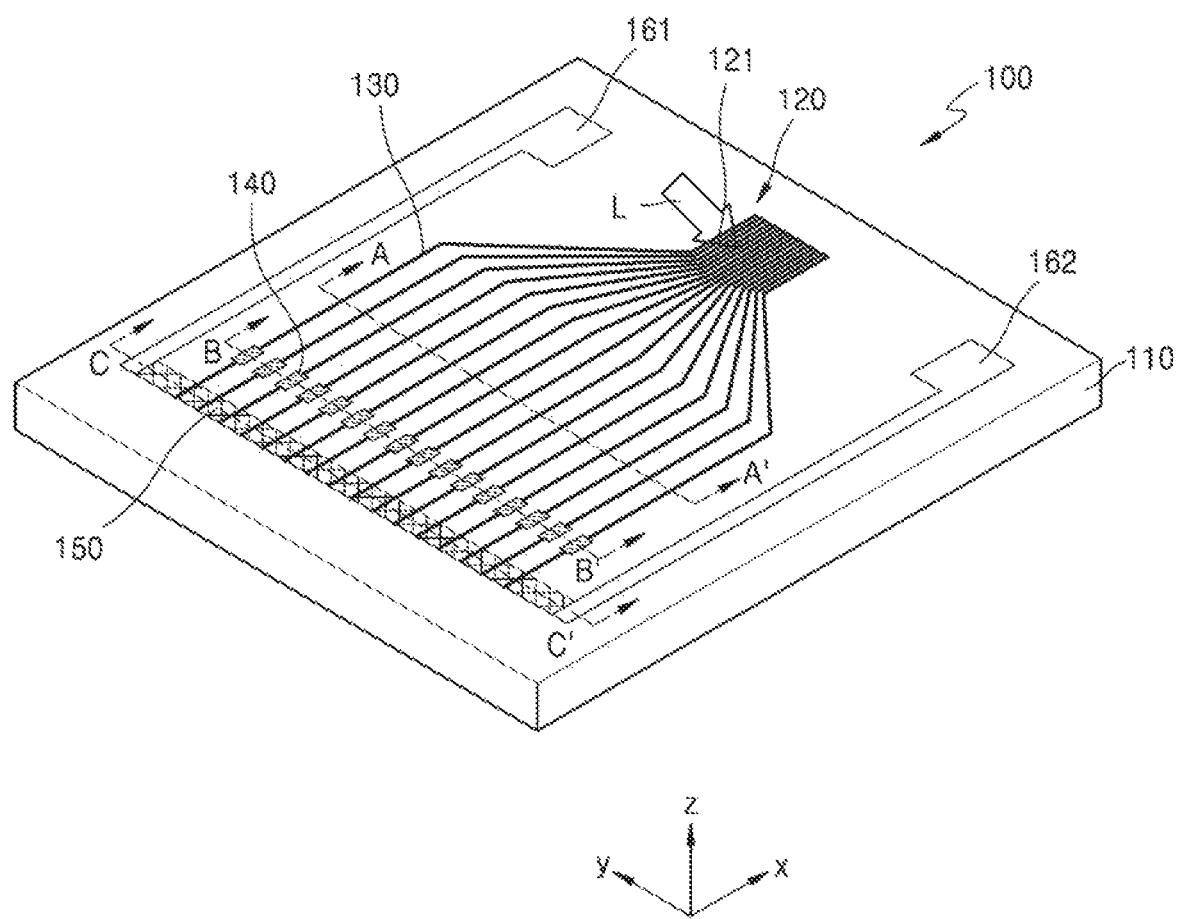
FIG. 1 is a perspective view schematically showing a light detecting device according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, what is described to be "above" or "on" may indicate not only one directly above and in contact, but also one above without contact. As used herein, the singular forms "a", "an" and "the" are intended to include the plural forms as well, unless the context clearly indicates otherwise. In addition, when a part "includes" a certain component, the part may further include another component instead of excluding the other component, unless otherwise stated.

The use of term "the" and similar terms may correspond to both singular and plural. When a certain embodiment may be implemented differently, a specific process order may be performed differently from the described order. For example, two consecutively described processes may be performed substantially at the same time or performed in an order opposite to the described order.

In the following description, terms such as "unit" and "module" indicate a unit for processing at least one function or operation, wherein the unit and the block may be embodied as hardware or software or embodied by combining hardware and software.

Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device.

The use of all examples or exemplary terms is merely for describing the technical ideas in detail and such examples and exemplary terms do not limit the scope of the present disclosure unless defined in the claims.

FIG. 1 illustrates a light detecting device 100 according to an example embodiment. In FIG. 1, the light detecting device 100 for detecting portion of light, for example, portion of light input after being reflected at an object, input from the outside by using an optical phased array (OPA) method is shown.

Referring to FIG. 1, the light detecting device 100 includes a plurality of waveguides 130, a light input device 120, a plurality of modulators 140, and a graphene layer 150. Here, elements forming the light detecting device 100 may be provided on a same substrate 110. However, embodiments are not limited thereto. The plurality of waveguides 130 may be arranged in an array form. For example, the plurality of waveguides 130 may be arranged in a 1-dimensional (1D) array on the substrate 110 in one direction, for example, a y-axis direction of FIG. 1. In FIG. 1, sixteen waveguides 130 are provided on the substrate 110, but the number of waveguides 130 may vary.

Figure 2:
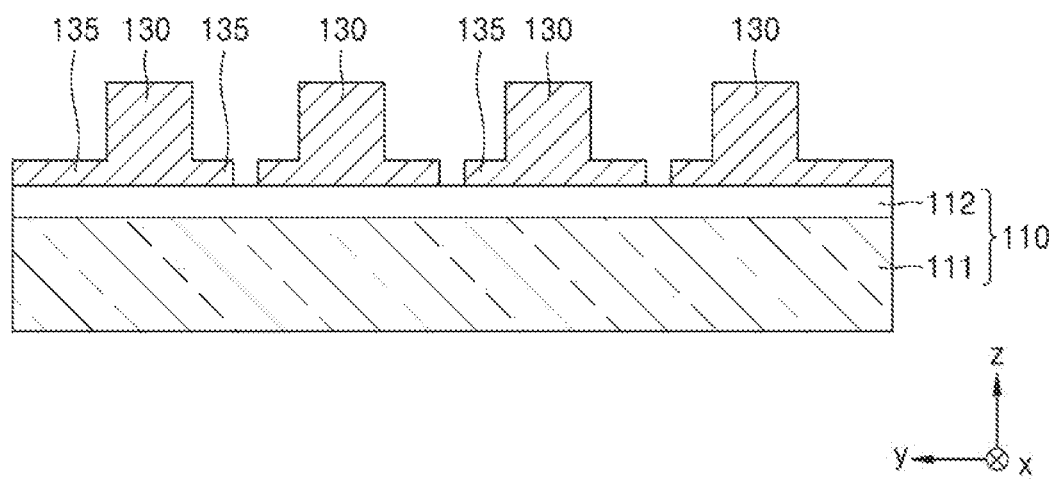
FIG. 2 is a cross-sectional view taken along a line A-A' of FIG. 1.

FIG. 2 is a cross-sectional view of the plurality of waveguides 130, taken along line A-A' of FIG. 1. As an example, four waveguides 130 are shown in FIG. 2 and the following drawings.

Referring to FIG. 2, the plurality of waveguides 130 are provided on the substrate 110. Here, the substrate 110 may include a material having an insulating surface. For example, the substrate 110 may include a base substrate 111 and an insulating layer 112 provided on a top surface of the base substrate 111. The base substrate 111 may include, for example, a semiconductor substrate such as a silicon substrate, but is not limited thereto. For example, the base substrate 111 may include other various materials. The insulating layer 112 may include, for example, a silicon oxide, but is not limited thereto, and the insulating layer 112 may include other various materials. Also, an insulating substrate may be used as the substrate 110.

The plurality of waveguides 130 are spaced apart from each other on the top surface of the substrate 110. The plurality of waveguides 130 are provided such that portion of light L input to the light input device 120 from the outside proceed therein. The waveguide 130 may include at least one of a semiconductor material, an oxide, and a nitride. Here, the semiconductor material may include, for example, a Group IV semiconductor material such as silicon (Si) or germanium (Ge), a Group III-V semiconductor material, or a Group II-VI semiconductor material. However, the semiconductor material is not limited thereto.

Extending portions 135 extending respectively from the plurality of waveguides 130 may be provided on the substrate 110 with a certain thickness. In FIG. 2, the extending portions 135 are spaced apart from each other between the waveguides 130 adjacent to each other. However, embodiments are not limited thereto. For example, the extending portions 135 may be connected to each other between the waveguides 130 adjacent to each other.

Figure 3:
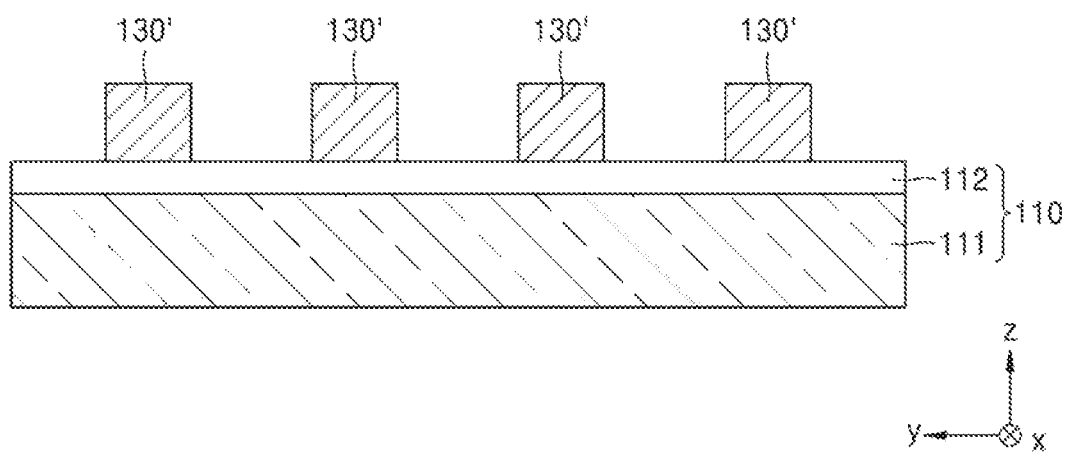
FIG. 3 is a view showing a modified example of a plurality of waveguides of FIG. 2.

FIG. 3 illustrates an example of the plurality of waveguides 130 of FIG. 2 according to another example embodiment. Referring to FIG. 3, a plurality of waveguides 130' are spaced apart from each other on the top surface of the substrate 110. Here, the extending portion 135 of FIG. 2 described above is not provided between the plurality of waveguides 130'.

Referring to FIG. 1, the light input device 120 into which the portion of light L are input from the outside is provided at one end portion of the plurality of waveguides 130. The light input device 120 may include an antenna array in which a plurality of antennas 121 are arranged in an array form. The plurality of antennas 121 may extend respectively from end portions of the plurality of waveguides 130. Here, the plurality of antennas 121 may include the same material as the plurality of waveguides 130, but embodiments are not limited thereto.

Figure 4:
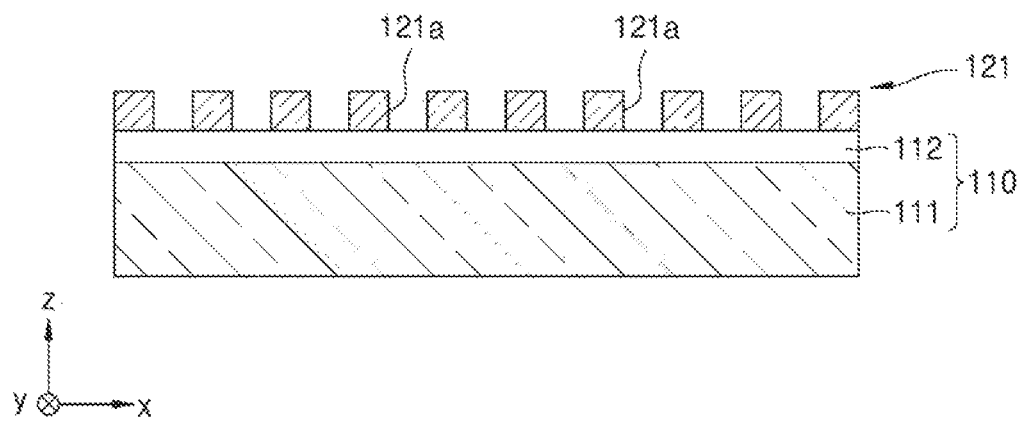
FIG. 4 is a cross-sectional view of an antenna of a light input unit of FIG. 1.

FIG. 4 illustrates a cross-sectional view of the antenna 121 of the light input device 120 of FIG. 1. In FIG. 4, illustrates a cross-section in which one of the antennas 121 included in the light input device 120 is cut in a length direction, for example, an x-axis direction of FIG. 1, of the antenna 121.

Referring to FIG. 4, the antenna 121 may have a grating structure in which a plurality of grooves 121a are formed at certain intervals. When the portion of light L, for example, portions of laser lights, are input from the outside to the light input device 120 including the antenna array, the portion of light L may proceed inside the plurality of waveguides 130 while phases thereof are modulated by the plurality of modulators 140 described below, and then may be extracted by the graphene layer 150.

Referring to FIG. 1, the plurality of modulators 140 are provided on the plurality of waveguides 130. The plurality of modulators 140 modulate the phases of the portion of light L proceeding inside the plurality of waveguides 130. The plurality of modulators 140 may form a certain phase profile by independently modulating the phases of the portion of light L proceeding inside the plurality of waveguides 130. The phase profile formed as such may depend on angles at which the external portion of light L are incident on the light input device 120. Accordingly, when the plurality of modulators 140 control the phase profile of the portion of light L proceeding inside the plurality of waveguides 130, light-receiving efficiency of portion of light emitted from an object located in a specific direction may be improved and a location of the object may be determined.

Figure 5:
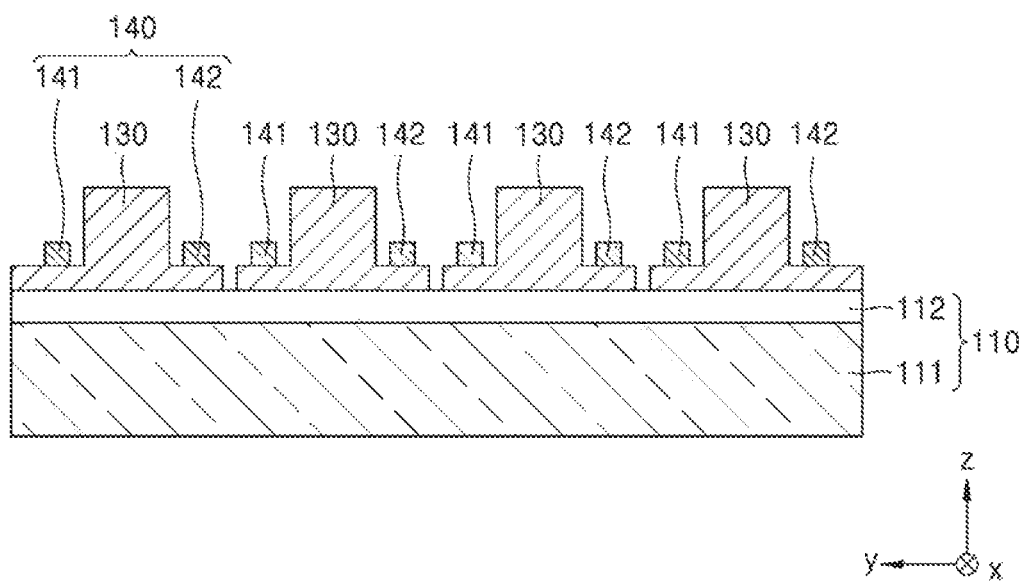
FIG. 5 is a cross-sectional view taken along a line B-B' of FIG. 1.

FIG. 5 illustrates a cross-sectional view of the plurality of modulators 140 taken along line B-B' of FIG. 1.

Referring to FIG. 5, the plurality of modulators 140 each include a pair of a first electrodes 141 and a second electrode 142 provided around the waveguide 130. Here, when a certain electric signal is applied between the first electrode 141 and the second electrodes 142, a refractive index of the waveguide 130 provided between the first electrode 141 and the second electrodes 142 is changed by the electric signal. Also, a phase of a light proceeding inside the waveguide 130 may be modulated by the change in the refractive index of the waveguide 130. As such, by applying a certain electric signal between the first electrode 141 and the second electrodes 142 of the modulator 140 provided corresponding to each of the plurality of waveguides 130, a certain phase profile may be formed by independently modulating phases of portion of light proceeding inside the plurality of waveguides 130.

Figure 6:
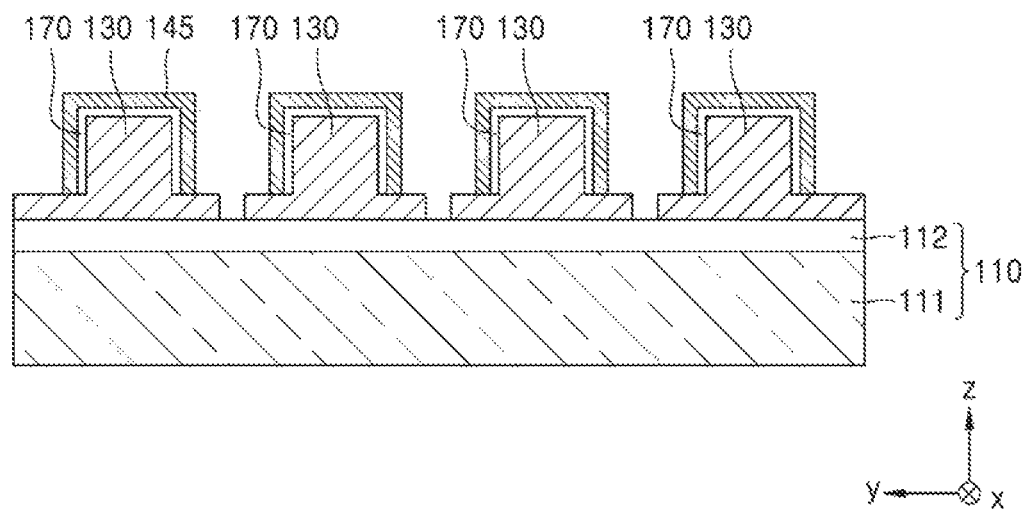
FIG. 6 is a view showing a modified example of a plurality of modulators of FIG. 5.

FIG. 6 illustrates another example of the plurality of modulators 140 according to an example embodiment.

Referring to FIG. 6, each of a plurality of modulators includes a heating element 145 provided around the waveguide 130. Here, an intermediate insulating layer 170 for preventing a contact between the heating element 145 and the waveguide 130 may be provided between the waveguide 130 and the heating element 145. When heat is applied to the waveguide 130 through the certain heating element 145, the refractive index of the waveguide 130 is changed. Also, a phase of light proceeding inside the waveguide 130 may be modulated by the change in the refractive index of the waveguide 130. As such, when the heating element 145 provided according to each of the plurality of waveguides 130 applies heat to the waveguide 130, phases of portion of light proceeding inside the plurality of waveguides 130 are independently modulated, thereby forming a certain phase profile.

Moreover, a method of applying an electric signal to the waveguide 130 or applying heat to the waveguide 130 has been described above as a method of changing the refractive index of the waveguide 130. However, this is only an example and another method may be used to change the refractive index of the waveguide 130. For example, a piezoelectric device may be provided around the waveguide 130 and the waveguide 130 may be modified via the piezoelectric device to change the refractive index of the waveguide 130.

Referring to FIG. 1, the graphene layer 150 is provided on the plurality of waveguides 130 that pass through the plurality of modulators 140. Here, the graphene layer 150 may absorb most of the portion of light L proceeding inside the plurality of waveguides 130. The first electrode 161 and the second electrode 162 are electrically and respectively connected to both end portions of the graphene layer 150.

The graphene layer 150 may have a single layer structure or a multilayer structure. For example, the graphene layer 150 may include one to ten graphenes, but is not limited thereto. Graphene is a material having a hexagonal honeycomb structure in which carbon atoms are connected two-dimensionally, and has a thin atomic thickness.

In the current embodiment, by arranging the graphene layer 150 on the plurality of waveguides 130, most of the portion of light L proceeding inside the plurality of waveguides 130 may be absorbed by the graphene layer 150, and accordingly, the light detecting device 100 having high light-receiving efficiency may be realized.

Figure 7:
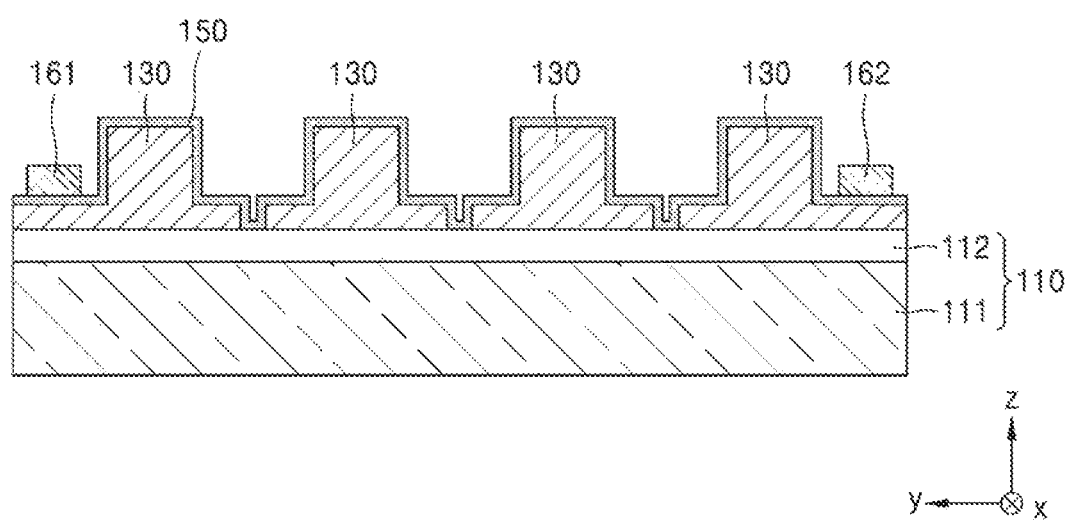
FIG. 7 is a cross-sectional view taken along a line C-C' of FIG. 1.

FIG. 7 illustrates a cross-sectional view of the graphene layer 150, taken along a line C-C' of FIG. 1.

Referring to FIG. 7, the graphene layer 150 is provided on the plurality of waveguides 130. Here, the graphene layer 150 is provided to contact top and side surfaces of each of the plurality of waveguides 130. In this case, portion of light proceeding inside the plurality of waveguides 130 may be absorbed by the graphene layer 150 via the top and side surfaces of each of the plurality of waveguides 130. The graphene layer 150 may be formed by growing at least one graphene on the plurality of waveguides 130 or by transferring at least one graphene on the plurality of waveguides 130. Moreover, a reflective film or a non-reflective film may be coated on the other end portions of the waveguides 130 that pass through the graphene layer 150.

The first electrode 161 and the second electrode 162 may be electrically connected to both end portions of the graphene layer 150. Here, the first electrode 161 and the second electrode 162 may include a material having excellent conductivity. The first electrode 161 and the second electrode 162 may be provided on a top surface of the substrate 110.

The portion of light proceeding inside the plurality of waveguides 130 while a certain voltage is applied between the first electrode 161 and the second electrode 162 may be mostly absorbed by the graphene layer 150, and at this time, electrons may be generated inside the graphene layer 150 and move between the first electrode 161 and the second electrode 162 to generate a light-receiving current. Such a light-receiving current is measured via the first electrode 161 and the second electrode 162 to detect the portion of light proceeding inside the plurality of waveguides 130. Here, the voltage applied between the first electrode 161 and the second electrode 162 may be adjusted to control the light-receiving current and the light-receiving efficiency.

Figure 8:
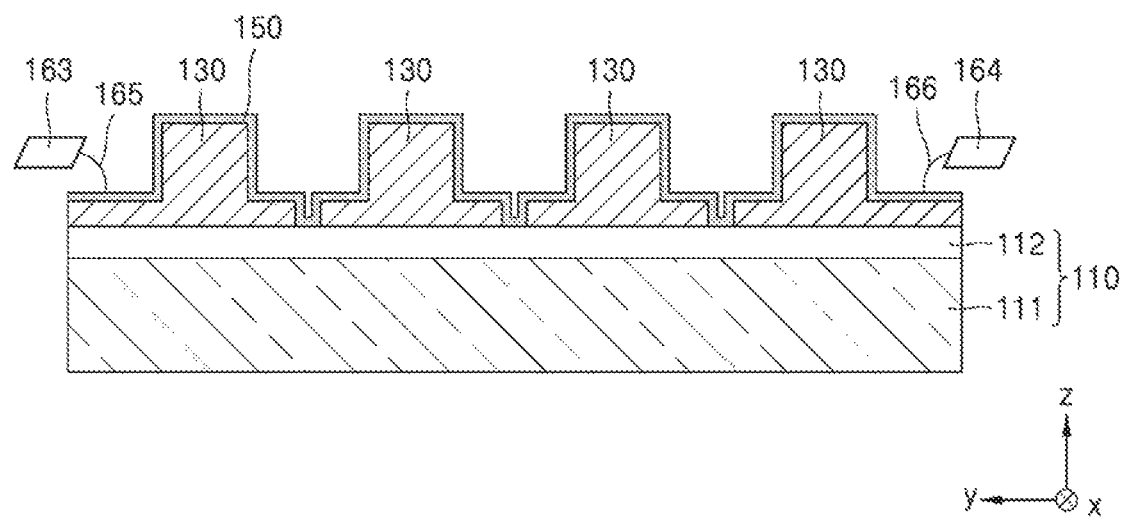
FIG. 8 is a view showing a modified example of first and second electrodes of FIG. 7.

FIG. 8 illustrates an example of the first electrode 161 and the second electrode 162 of FIG. 7. Referring to FIG. 8, the first electrode 163 and the second electrode 164 may be electrically connected to both ends of the graphene layer 150 via the first wire 165 and the second wire 166, respectively. Here, the first electrode 163 and the second electrode 164 may be spaced apart from the substrate 110. However, this is only an example and the first electrode 163 and the second electrode 164 may be provided on the top surface of the substrate 110.

In the light detecting device 100 having such a structure, when external portion of light, for example, portion of light reflected from an object are input to the light input device 120, the portion of light proceed along the plurality of waveguides 130. Also, phases of the portion of light proceeding inside the plurality of waveguides 130 are modulated by the plurality of modulators 140, and the portion of light are absorbed by the graphene layer 150 provided on the plurality of waveguides 130 to be detected through the first electrode 161 and the second electrode 162.

In the example embodiment, because the graphene layer 150 absorbs most of the portion of light proceeding inside the plurality of waveguides 130, the light detecting device 100 having a relatively high light-receiving efficiency may be realized. Also, when the plurality of modulators 140 control a phase profile by independently modulating the phases of the portion of light proceeding inside the plurality of waveguides 130, the light-receiving efficiency may be further improved and locations at which the external portion of light are incident may be determined.

As such, because the light detecting device 100 is configured to receive light in a specific direction with high efficiency, for example, a light detection and ranging (LiDAR) system for long distances may be more easily implemented. Also, because the LiDAR system may reduce the intensity of output light of a light-emitting device, eye safety may be improved, and miniaturization and low costs of a system may be realized.

Figure 9:
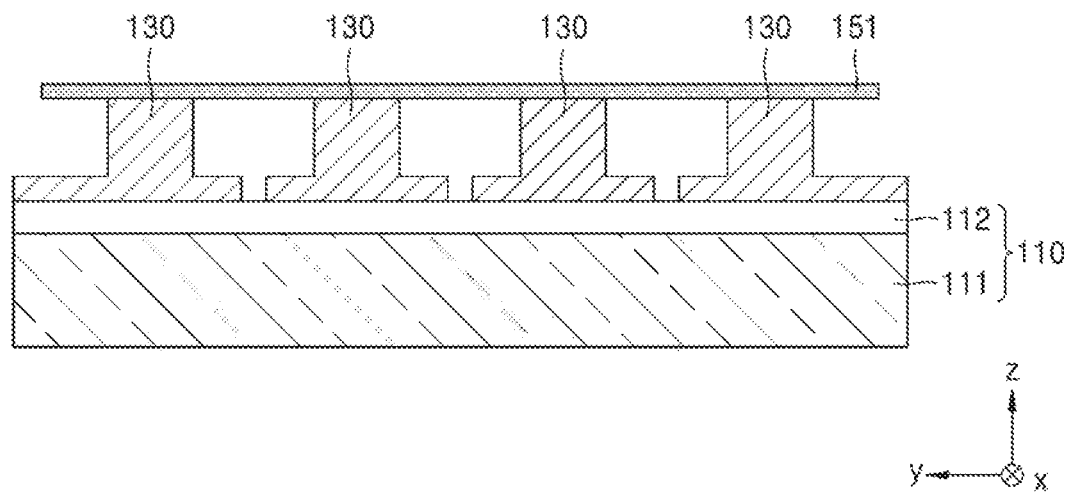
FIG. 9 is a view of a light detecting device according to another example embodiment.

FIG. 9 illustrates a light detecting device according to another example embodiment.

Referring to FIG. 9, a graphene layer 151 may be provided to contact a top surface of each of the plurality of waveguides 130. In this case, portion of light proceeding inside the plurality of waveguides 130 may be absorbed by the graphene layer 151 via the top surface of each of the waveguides 130. Cross-sectional shapes of the portion of light proceeding inside the plurality of waveguides 130 may vary depending on an optical mode. When the portion of light proceeding inside the plurality of waveguides 130 have a cross-section of an oval shape relatively long in an up-and-down direction, the graphene layer 151 may be provided to contact the top surface of the waveguides 130 as shown in FIG. 9 such as to effectively absorb the portion of light proceeding inside the waveguides 130.

Figure 10:
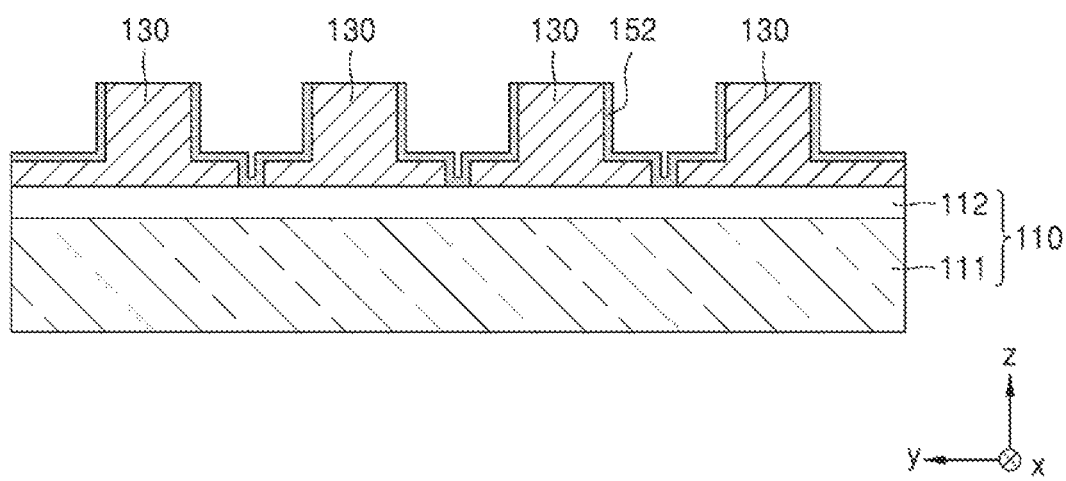
FIG. 10 is a view of a light detecting device according to another example embodiment.

FIG. 10 illustrates a light detecting device according to another example embodiment.

Referring to FIG. 10, a graphene layer 152 may be provided to contact side surfaces of each of the plurality of waveguides 130. Here, portion of light proceeding inside the plurality of waveguides 130 may be absorbed by the graphene layer 152 via the side surfaces of each of the waveguides 130. Portions of the graphene layer 152 excluding a portion contacting the side surfaces of the waveguides 130 may be integrally connected to each other.

When the portion of light proceeding inside the plurality of waveguides 130 have a cross-section of an oval shape relatively long in a left-and-right direction, the graphene layer 152 may be provided to contact the side surfaces of the waveguides 130, as shown in FIG. 10, to more effectively absorb the portion of light proceeding inside the waveguides 130.

Figure 11:
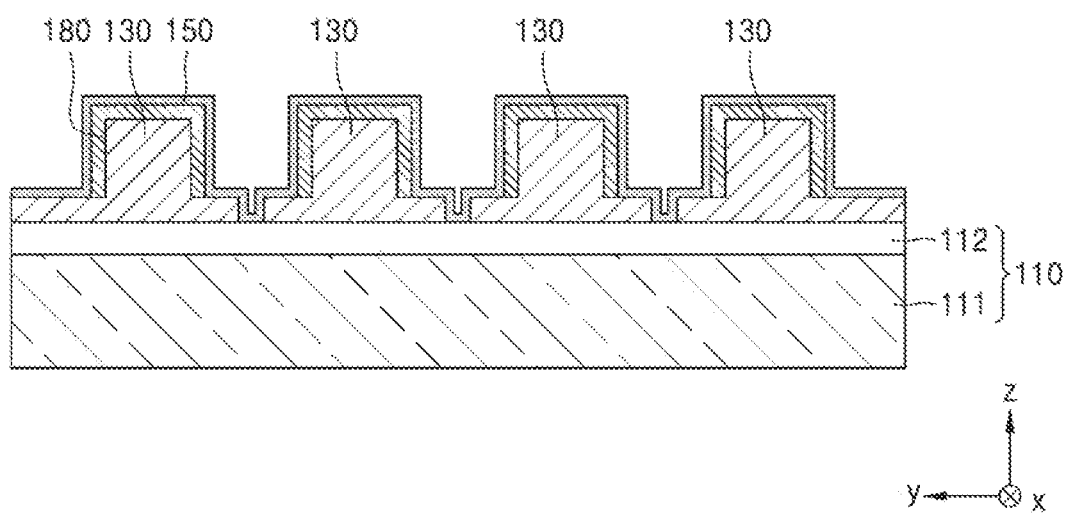
FIG. 11 is a view of a light detecting device according to another example embodiment.

FIG. 11 illustrates a light detecting device according to another example embodiment.

Referring to FIG. 11, an intermediate layer 180 is provided between the waveguide 130 and the graphene layer 150. Here, the intermediate layer 180 may include a material having a lower refractive index than the waveguide 130. By adjusting the material or thickness of the intermediate layer 180, the intermediate layer 180 may control the amount of light absorbed by the graphene layer 150.

Figure 12:
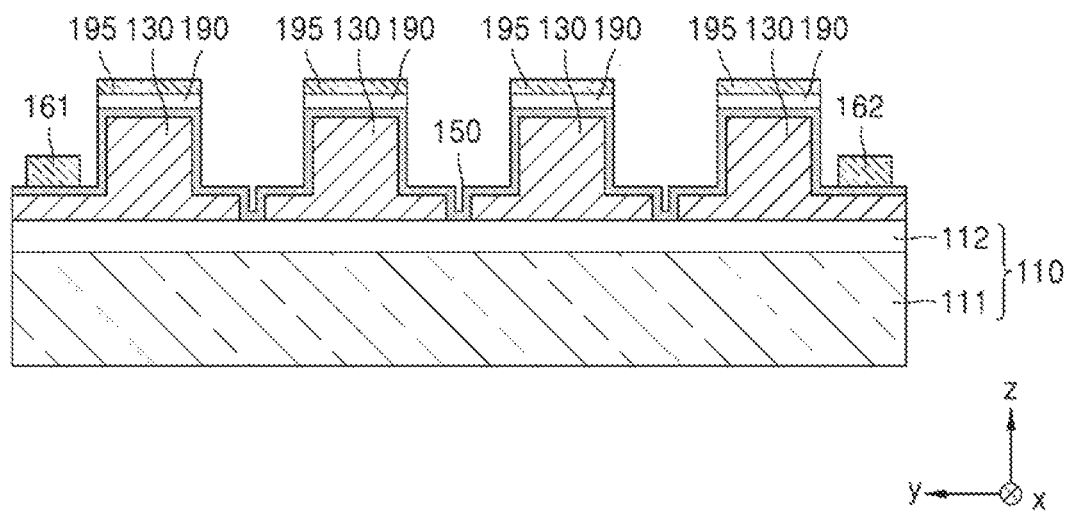
FIG. 12 is a view of a light detecting device according to another example embodiment.

FIG. 12 illustrates a light detecting device according to another example embodiment.

Referring to FIG. 12, a gate insulating layer 190 is provided on a top surface of each of the plurality of waveguides 130, and a gate electrode 195 is provided on a top surface of the gate insulating layer 190. The first electrode 161 and the second electrode 162 may respectively include a source electrode and a drain electrode. In this case, a light-receiving characteristic of the light detecting device may be controlled by adjusting voltages applied to the first electrode 161 and the second electrode 162 and the gate electrode 195.

In the above example embodiments, one graphene layer 150 is provided correspondingly to all of the plurality of waveguides 130. However, as described below, a plurality of graphene layers may be provided according to some of a plurality of waveguides. In this case, light detection may be performed by driving all of the graphene layers or by independently driving the graphene layers.

Figure 13:
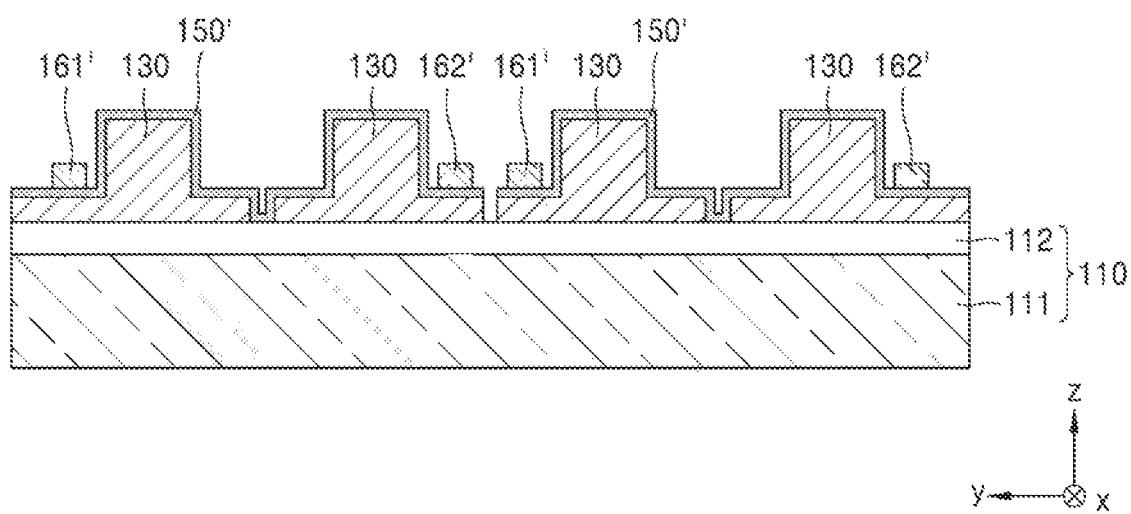
FIG. 13 is a view of a light detecting device according to another example embodiment.

FIG. 13 illustrates a light detecting device according to another example embodiment.

Referring to FIG. 13, a plurality of graphene layers 150' are provided on the plurality of waveguides 130. In FIG. 13, two graphene layers 150' are provided on four waveguides 130. Here, each graphene layer 150' may correspond to two waveguides 130. Also, the first electrode 161' and the second electrode 162' are electrically connected to each graphene layer 150'.

Figure 14:
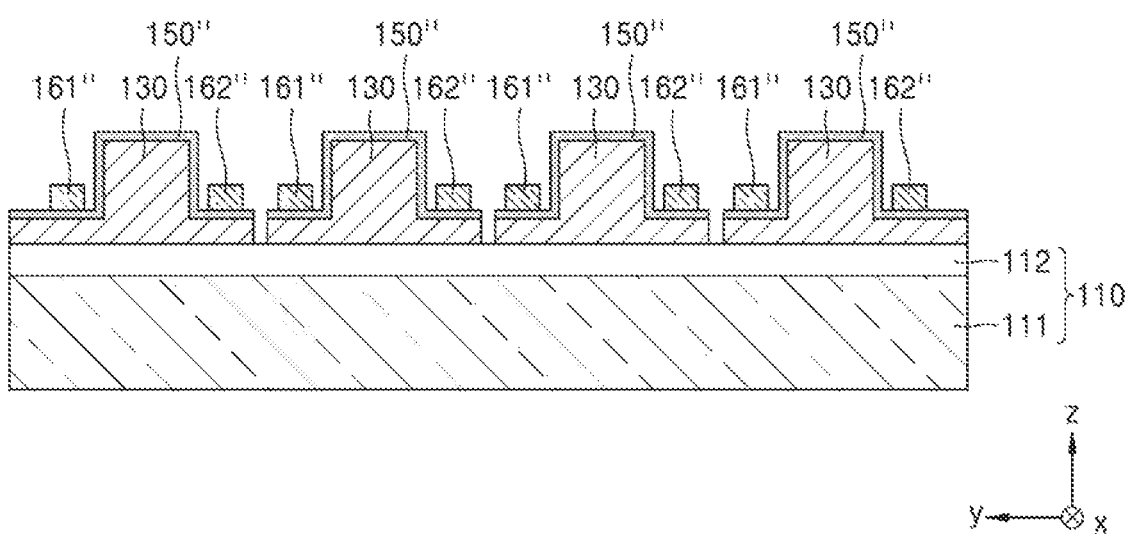
FIG. 14 is a view of a light detecting device according to another example embodiment.

FIG. 14 illustrates a light detecting device according to another example embodiment.

Referring to FIG. 14, a plurality of graphene layers 150" are provided on the plurality of waveguides 130 in a one-to-one manner. In FIG. 13, four graphene layers 150" are provided on four waveguides 130, respectively. Here, each graphene layer 150" may correspond to each waveguide 130, and the first electrode 161" and the second electrode 162" are electrically connected to each graphene layer 150".

Figure 15:
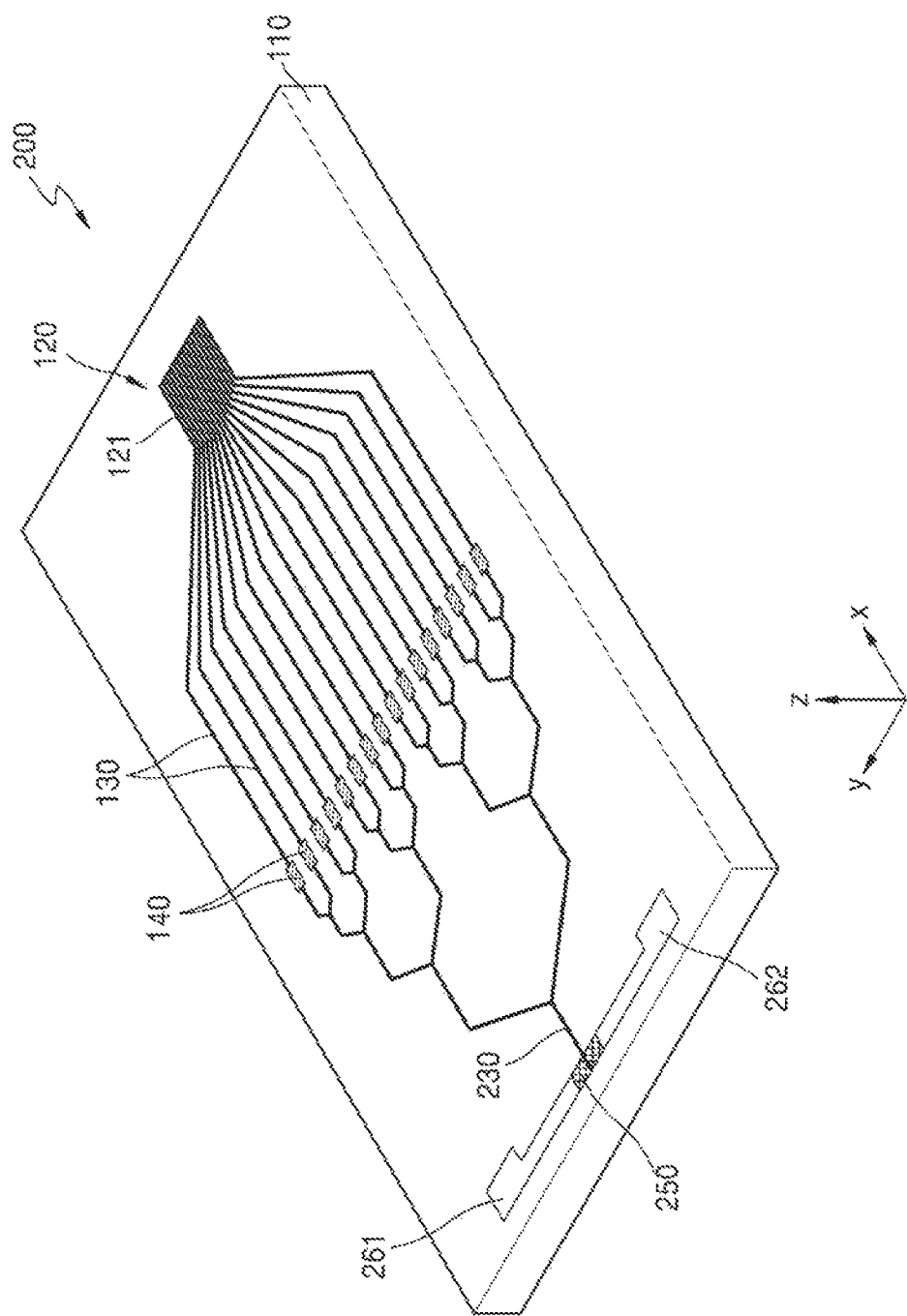
FIG. 15 is a perspective view schematically showing a light detecting device according to another example embodiment.

FIG. 15 illustrates a light detecting device 200 according to another example embodiment. The plurality of waveguides 130, the light input device 120, and the plurality of modulators 140 of the light detecting device 200 of FIG. 15 have been described above with reference to the light detecting device 100 of FIG. 1.

Referring to FIG. 15, the plurality of waveguides 130 that pass through the plurality of modulators 140 may be combined with each other to be integrated into one waveguide 230. A graphene layer 250 is provided on the waveguide 230 and the first electrode 261 and the second electrode 262 are electrically connected to both end portions of the graphene layer 250.

Portion of light proceeding inside the plurality of waveguides 130 are combined with each other in the waveguide 230 and the combined portion of light are absorbed by the graphene layer 250 to be detected via the first electrode 261 and the second electrode 262.

According to the above example embodiments, as a graphene layer absorbs most of portion of light proceeding inside a plurality of waveguides, a light detecting device having a relatively high light-receiving efficiency may be implemented. Also, the light-receiving efficiency may be further improved as a plurality of modulators independently modulate phases of the portion of light proceeding inside the plurality of waveguides to control a phase profile.

Because the light detecting device described above is capable of receiving light in a specific direction with high efficiency, for example, a LiDAR system for long distances may be more easily implemented. Also, because the LiDAR system may reduce the intensity of output light of a light-emitting device, eye safety may be improved, and miniaturization and low costs of a system may be realized.

Such a light detecting device may be applied to a field of identifying an object or a terrain or measuring a location, distance, and shape by using light. For example, the light detecting device may be applied to fields of image sensors, distance sensors, environmental sensors, autonomous vehicles, flying objects such as drones, mobile devices, walking tools, and security devices.

Figure 16:
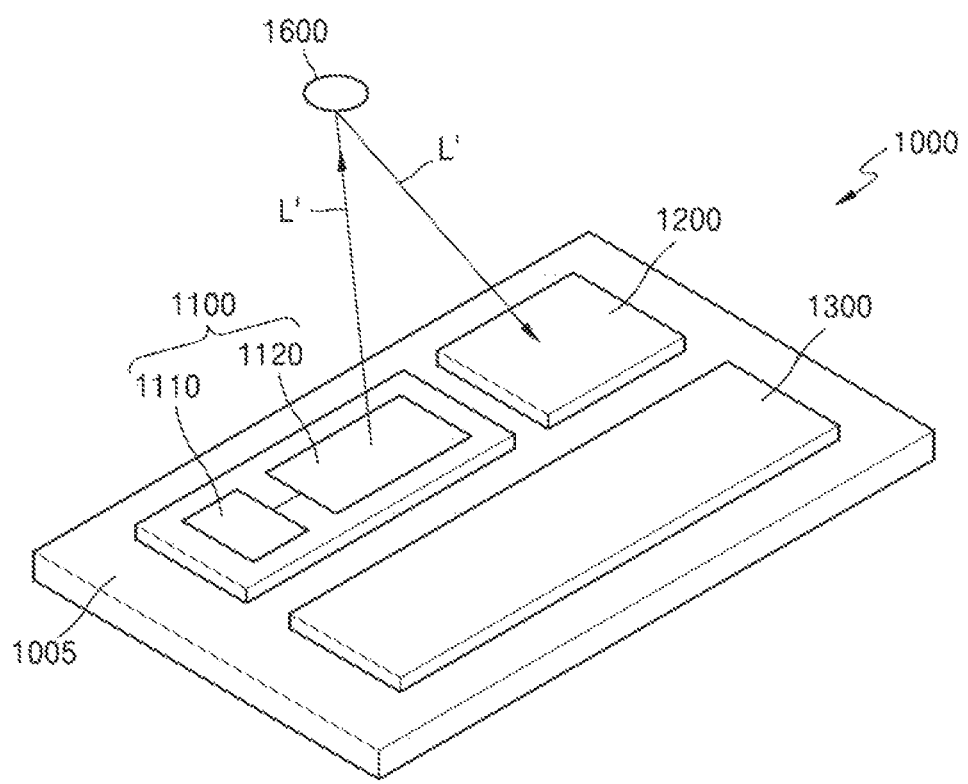
FIG. 16 is a view schematically showing an optical system according to an example embodiment.

FIG. 16 illustrates an optical system 1000 according to an example embodiment.

Referring to FIG. 16, the optical system 1000 may include a light steering apparatus 1100, a light detecting device 1200, and a driving device 1300. Here, the driving device 1300 may include a driving circuit for driving the light steering apparatus 1100 and the light detecting device 1200. Elements forming the optical system 1000 may be provided on a same substrate 1005. However, embodiments are not limited thereto, and some of the elements forming the optical system 1000 may not be provided in the same substrate 1005.

The light steering apparatus 1100 includes a laser light source 1110 emitting a laser beam L' and a steering device 1120 scanning the laser beam L' emitted from the laser light source 1110. A laser diode, for example, may be used as the laser light source 1110, but embodiments are not limited thereto.

The steering device 1120 may be configured to scan the laser beam L' by using, for example, an optical phased array (OPA) method. In this case, the steering device 1120 may scan the laser beam L' by using interference of portion of light of which phases are modulated and emitted from a plurality of device cells having a meta structure or from a plurality of waveguides.

When the steering device 1120 includes the plurality of waveguides, the laser beam L' may be two-dimensionally scanned via phase modulation and wavelength modulation. Also, when the steering device 1120 includes the plurality of cells arranged two-dimensionally, the laser beam L' may be scanned two-dimensionally.

Moreover, in addition to the OPA method described above, the steering device 1120 may use a method of mechanically moving the laser light source 1110 or a flash method in which laser beams are simultaneously emitted from a plurality of laser light sources.

The laser beam L' reflected from an object 1600 among the laser beams L' scanned by the light steering apparatus 1100 may be detected by the light detecting device 1200. Here, the light detecting device 1200 may be one of light detecting devices according to the above-described example embodiments.

The optical system 1000 described above may be used in, for example, a LiDAR system, a depth sensor, or a 3D sensor. However, this is only an example and the optical system 1000 may be applied to other various fields.

According to the example embodiments described above, because a graphene layer absorbs most of portion of light proceeding inside a plurality of waveguides, a light detecting device and optical system having a relatively high light-receiving efficiency may be implemented. Also, when a plurality of modulators control a phase profile by independently modulating phases of the portion of light proceeding inside the plurality of waveguides, the light-receiving efficiency may be improved and locations at which external portion of light are incident may be determined. Because the light detecting device is capable of receiving light in a specific direction with high efficiency, for example, a LiDAR system for long distances may be easily implemented. Also, because the LiDAR system may reduce the intensity of output light of a light-emitting device, eye safety may be improved, and miniaturization and low costs of a system may be realized.

It should be understood that example embodiments described herein should be considered in a descriptive sense only and not for purposes of limitation. Descriptions of features or aspects within each example embodiment should typically be considered as available for other similar features or aspects in other embodiments.

While example embodiments have been described with reference to the figures, it will be understood by those of ordinary skill in the art that various changes in form and details may be made therein without departing from the spirit and scope as defined by the following claims.

What is claimed is:

1. A light detecting device comprising:
   a light input device configured to receive light;
   a plurality of waveguides extending in a first direction from the light input device, the plurality of waveguides being configured to transmit portions of the light received by the light input device and comprising an extending portion that extends in a second direction that is perpendicular to the first direction, respectively;
   a plurality of modulators provided on the plurality of waveguides and configured to modulate phases of the portions of light transmitted in the plurality of waveguides, respectively, the plurality of modulators respectively comprising a first modulator electrode and a second modulator electrode which are provided on the extending portion;
   at least one graphene layer configured to absorb the portions of light transmitted in the plurality of waveguides;
   an intermediate layer provided between the at least one graphene layer and each of the plurality of waveguides, the intermediate layer comprising a material having a refractive index that is less than a refractive index of each of the plurality of waveguides and being discontinuous between adjacent waveguides among the plurality of waveguides; and
   at least one first electrode and at least one second electrode electrically connected to the at least one graphene layer, respectively.

2. The light detecting device of claim 1, wherein the at least one graphene layer is provided on the plurality of waveguides.

3. The light detecting device of claim 2, wherein the at least one graphene layer is provided on at least one of a top surface and a side surface of the plurality of waveguides.

4. The light detecting device of claim 2, wherein the at least one graphene layer comprises a graphene layer corresponding to all of the plurality of waveguides.

5. The light detecting device of claim 2, wherein the at least one graphene layer comprises a plurality of graphene layers respectively corresponding to some of the plurality of waveguides.

6. The light detecting device of claim 1, wherein the plurality of waveguides are integrated into one waveguide at one end of each of the plurality of waveguides, and the at least one graphene layer comprises a graphene layer provided on the integrated waveguide.

7. The light detecting device of claim 1, further comprising a gate insulating layer provided on the at least one graphene layer and a gate electrode provided on the gate insulating layer.

8. The light detecting device of claim 1, wherein the light input device comprises an antenna array provided at an end portion of the plurality of waveguides and configured to receive light from an outside of the light detecting device.

9. The light detecting device of claim 1, wherein the plurality of waveguides comprise at least one of a Group IV semiconductor material, a Group III-V semiconductor material, a Group II-VI semiconductor material, an oxide, and a nitride.

10. The light detecting device of claim 1, wherein the plurality of modulators are configured to form a phase profile by independently modulating a phase of each of the portions of light transmitted in the plurality of waveguides.

11. The light detecting device of claim 10, wherein the plurality of modulators are further configured to modulate the phase based on applying an electric signal or heat to each of the plurality of waveguides.

12. The light detecting device of claim 1, wherein the light input device, the plurality of waveguides, the plurality of modulators, the at least one graphene layer, and the at least one first electrode and the at least one second electrode are provided on a same substrate.

13. An optical system comprising:
   a light steering apparatus configured to steer light; and
   a light detecting device configured to detect the light steered by the light steering apparatus;
   wherein the light detecting device comprises:
      a light input device;
      a plurality of waveguides extending in a first direction from the light input device, being configured to transmit portions of light input to the light input device, and comprising an extending portion that extends in a second direction that is perpendicular to the first direction, respectively;
      a plurality of modulators provided on the plurality of waveguides and configured to modulate phases of the portions of the light transmitted in the plurality of waveguides, respectively, the plurality of modulators respectively comprising a first modulator electrode and a second modulator electrode which are provided on the extending portion;
      at least one graphene layer configured to absorb the portions of the light transmitted in the plurality of waveguides;
      an intermediate layer provided between the at least one graphene layer and each of the plurality of waveguides, the intermediate layer comprising a material having a refractive index that is less than a refractive index of each of the plurality of waveguides and being discontinuous between adjacent waveguides among the plurality of waveguides; and
      at least one first electrode and at least one second electrode electrically connected to the at least one graphene layer.

14. The optical system of claim 13, wherein the light steering apparatus comprises a laser light source and a steering device configured to steer the portions of the light emitted from the laser light source.

15. The optical system of claim 14, wherein the light input device further comprises an antenna array provided at an end portion of the plurality of waveguides and configured to receive the light steered by the light steering apparatus.

16. The optical system of claim 13, wherein the at least one graphene layer is provided on the plurality of waveguides.

17. The optical system of claim 13, wherein the plurality of waveguides are integrated into one waveguide at an end portion of the plurality of waveguides, and the at least one graphene layer comprises a graphene layer provided on the integrated waveguide.

18. The optical system of claim 13, wherein the light steering apparatus and the light detecting device are provided on a same substrate.

19. The light detecting device of claim 1, wherein the at least one first electrode and the at least one second electrode are directly provided on the at least one graphene layer.

20. The light detecting device of claim 1, wherein the at least one first electrode and the at least one second electrode are connected to the at least one graphene layer by conductive wires.

21. The light detecting device of claim 5, wherein each of the plurality of graphene layers correspond to each of the plurality of waveguides, respectively, and wherein each of the plurality of graphene layers are spaced apart from each other.

\* \* \* \* \*